United States Patent
Garofalo

(10) Patent No.: US 11,854,647 B2
(45) Date of Patent: Dec. 26, 2023

(54) VOLTAGE LEVEL SHIFTER TRANSITION TIME REDUCTION

(71) Applicant: Micron Technology, Inc., Boise, ID (US)

(72) Inventor: Pierguido Garofalo, San Donato (IT)

(73) Assignee: Micron Technology, Inc., Boise, ID (US)

( * ) Notice: Subject to any disclaimer, the term of this patent is extended or adjusted under 35 U.S.C. 154(b) by 280 days.

(21) Appl. No.: 17/388,359

(22) Filed: Jul. 29, 2021

(65) Prior Publication Data

US 2023/0036502 A1 Feb. 2, 2023

(51) Int. Cl.
*G11C 5/14* (2006.01)
*G05F 1/46* (2006.01)
*G05F 1/59* (2006.01)
*G05F 1/575* (2006.01)

(52) U.S. Cl.
CPC .............. *G11C 5/147* (2013.01); *G05F 1/462* (2013.01); *G05F 1/575* (2013.01); *G05F 1/59* (2013.01)

(58) Field of Classification Search
CPC ......... G11C 5/147; G11C 7/1084; G11C 8/08; G11C 11/4093; G11C 11/4085; G11C 16/08; G05F 1/462; G05F 1/575; G05F 1/59
See application file for complete search history.

(56) References Cited

U.S. PATENT DOCUMENTS

| | | | |
|---|---|---|---|
| 6,337,831 B1* | 1/2002 | Nam | G11C 8/08 365/230.01 |
| 10,014,861 B2 | 7/2018 | Luthra | |
| 10,911,049 B2 | 2/2021 | Cui et al. | |
| 10,985,738 B1 | 4/2021 | Penney | |
| 2001/0036108 A1* | 11/2001 | Takano | G11C 16/08 365/185.18 |
| 2006/0279346 A1* | 12/2006 | Seki | H03K 3/35613 327/333 |
| 2007/0002636 A1* | 1/2007 | Campbell | G11C 7/12 365/189.04 |
| 2008/0106947 A1* | 5/2008 | Cho | G11C 16/08 365/185.23 |
| 2017/0206941 A1* | 7/2017 | Po | H10B 41/60 |
| 2018/0358062 A1* | 12/2018 | DeBrosse | G11C 11/2257 |
| 2020/0052678 A1* | 2/2020 | Chen | H03K 19/018521 |
| 2020/0203990 A1* | 6/2020 | Fei | G05F 1/59 |
| 2021/0183413 A1* | 6/2021 | Lee | G11C 16/10 |
| 2023/0010835 A1* | 1/2023 | Lin | G05F 1/56 |

* cited by examiner

*Primary Examiner* — Khamdan N. Alrobaie
(74) *Attorney, Agent, or Firm* — Schwegman Lundberg & Woessner, P.A.

(57) ABSTRACT

A level shifter receives an input signal in a first power domain and generates a corresponding output signal in a second power domain. The transition time of the output signal may be longer during a low-to-high transition than during a high-to-low transition or vice versa. The level shifter may provide two outputs, wherein one of the two outputs has a shorter transition time during a high-to-low transition and the other output has a shorter transition time during a low-to-high transition. By using an inverter on the second output, two non-inverted outputs are generated with different transition times. A ramp selection circuit is used to select between the first output and the inverted second output. The ramp selection circuit selects the output with the shortest transition time.

23 Claims, 10 Drawing Sheets

US 11,854,647 B2

VOLTAGE LEVEL SHIFTER TRANSITION TIME REDUCTION

TECHNICAL FIELD

Embodiments of the disclosure relate generally to voltage level shifters and more specifically to systems and methods for reducing the transition time between output voltage levels of a level shifter.

BACKGROUND

Level shifters receive an input signal with a first voltage range and generate an output signal with a second voltage range. Due to the design of conventional level shifter circuits, the transition time between voltage levels of the output signal is asymmetrical.

BRIEF DESCRIPTION OF THE SEVERAL VIEWS OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

To easily identify the discussion of any particular element or act, the most significant digit or digits in a reference number refer to the figure number in which that element is first introduced.

DETAILED DESCRIPTION

Figure 1:
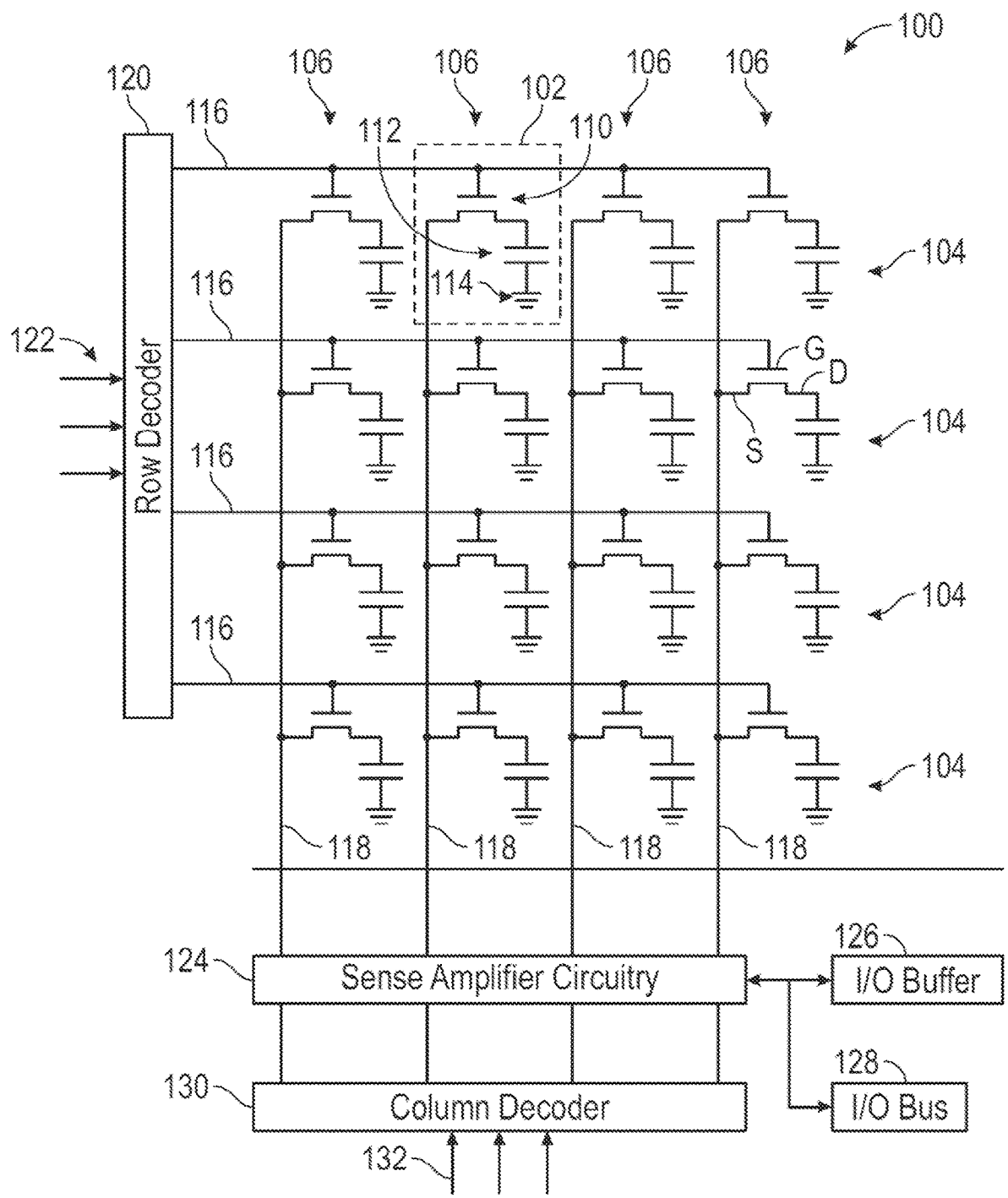
FIG. 1 is a schematic diagram of an example DRAM device according to various embodiments.

A semiconductor device is an electronic component that relies on the electronic properties of a semiconductor material (primarily silicon, germanium, and gallium arsenide, as well as organic semiconductors) for its function. Example semiconductor devices include discrete devices and integrated circuits (ICs), which comprise two or more devices (e.g., hundreds, thousands, millions, or billions of transistors in a single IC) interconnected on a single semiconductor substrate.

A power domain is defined by two electrical voltages between which an electrical circuit can operate. Some electronic systems operate in more than one power domain. For example, a processor may operate between 1.5V and ground. The processor generates control signals that control devices that operate at higher voltages. For example, a wordline of a memory chip may operate between 5.0V and ground. As another example, the control signals may control a motor of an electric vehicle that operates between 350V and ground. The ground circuits of the two power domains may be unconnected, allowing for differences in both the upper and lower operating voltages of the two power domains.

A level shifter receives an input signal in a first power domain and generates a corresponding output signal in a second power domain. Some level shifters only change either the upper or lower limit of the voltage range, leaving the other limit unchanged. Two such level shifters may be used in series to convert the input signal from an input power domain to an output power domain via an intermediate power domain.

The transition time of the input signal from the high operating voltage to the low operating voltage of the input power domain is within a predetermined range of the transition time of the input signal from the low operating voltage to the high operating voltage of the input power domain. However, due to the properties of the level shifter circuit, the transition time of the output signal from the high operating voltage to the low operating voltage of the output power domain is not within the same predetermined range of the transition time of the output signal from the low operating voltage to the high operating voltage of the output power domain. The longer transition time may cause problems in systems expecting binary inputs, since the output of the level shifter spends, for one of the two transitions, a longer period of time between the high and low operating voltages.

The level shifter may provide two outputs. During steady-state operation, in which the input signal is unchanging, the value of the second output is the inverse of the value of the first output. However, during transition from one voltage to another, the transition times of the two outputs are not equal. One of the two outputs has a shorter transition time during a high-to-low transition and the other output has a shorter transition time during a low-to-high transition, or vice versa, according to the output power domain of the level shifter. By using an inverter on the second output, two non-inverted outputs are generated with different transition times.

As discussed herein, a ramp selection circuit is used to select between the first output and the inverted second output. The ramp selection circuit selects the output with the shortest transition time. As a result, the difference in the transition times between the low-to-high transition and the high-to-low transition of the ramp selection circuit is reduced by comparison with either output of the level shifter.

A delay circuit may be used in the ramp selection circuit that feeds back the current output of the ramp selection circuit, after a delay. The delay may be selected based on the longer transition time of the two outputs of the level shifter. Using the signal from the delay circuit facilitates a determination by the ramp selection circuit that a transition is occurring and selection of the output from the level shifter with the lower transition time.

By use of the ramp selection circuit, the maximum transition time of the output voltage is reduced. As a result, the efficiency of the component being driven by the output signal is increased, reducing power losses during transition and improving predictability of operation.

A typical transistor, such as an N-channel metal-oxide-semiconductor field-effect transistor (MOSFET) has a constant threshold voltage. The threshold voltage is the minimum voltage applied to the gate of the transistor that allows current to flow from the source to the drain. Thus, a typical transistor is a control device, not a storage device. A NAND cell includes a charge storage element, the charge of which affects the threshold voltage of the NAND cell. Such charge storage elements can be, for example, a charge trap region or structure, selectively storing charge in a dielectric material; or alternatively a floating gate, typically selectively storing charge in a polysilicon structure. All of the above charge storage structures or regions are generically referred herein to as "charge storage elements." Thus, by applying a voltage to the gate and detecting if current flows from the source to the drain, the NAND cell can be used as a data storage device.

Additionally, multiple different charge levels of the charge storage element are possible, allowing for multiple bits of data to be stored in a single NAND cell. For example, the cell may hold a 00 value when the threshold voltage is 0V, a 01 value when the threshold voltage is 0.5V, a 10 value when the threshold voltage is 1.0V, and a 11 value when the threshold voltage is 1.5V.

Because of physical differences in individual NAND cells, the process of programming an MLC is iterative. A programming voltage is applied to add or remove charge from the charge storage elements. A verify voltage is applied to determine the threshold voltage of the programmed NAND cell. If the threshold voltage corresponds to the intended stored value, the programming is complete. Otherwise, the process repeats. In this way, each NAND cell can be successfully programmed even if the NAND cells in a device have different physical characteristics.

FIG. 1 provides a schematic of an example DRAM device 100 according to various embodiments. The device includes an array of memory cells 102 (only one being labeled in FIG. 1 to avoid obfuscation) arranged in rows 104 and columns 106. For simplicity, and sufficiently for purposes of explaining fundamental components and the basic operation of the memory device 100, the array is shown in only two dimensions; the array can be extended into the third dimension. Further, while only four rows 104 and columns 106 are illustrated, it is to be understood that DRAM devices can, in practice, include many more (e.g., tens, hundreds, or thousands of) memory cells 102 per row and/or per column.

In accordance with various embodiments, each memory cell 102 includes a single transistor 110 (e.g., a field effect transistor (FET)) and a single capacitor 112; such a cell is, therefore, also commonly referred to as a 1T1C cell. One plate of the capacitor 112, herein also the "node plate," is connected to the drain terminal ("D") of the transistor 110, whereas the other plate of the capacitor 112 is connected to ground 114. Each capacitor 112 within the array of 1T1C cells 102 serves to store one bit of data, and the respective transistor 110 serves as an "access device" to write to or read from the storage capacitor 112.

The transistor gate terminal terminals ("G") within each row 104 are portions of respective access lines (alternatively referred to as "word lines") 116 (and may be formed of the same material, or a different material), and the transistor source terminals ("S") within each column 106 are electrically connected to respective data lines (alternatively referred to as "bit lines") 118. A row decoder 120 can selectively drive the individual access lines 116, responsive to row address signals 122 input to the row decoder 120. Driving a given access line 116 at a high voltage causes the access transistors 110 within the respective row 104 to conduct, thereby connecting the storage capacitors 112 within the row 104 to the respective data lines 118, such that charge can be transferred between the data lines 118 and the storage capacitors 112 as required for read or write operations. Both read and write operations can be performed via sense amplifier circuitry 124, which can transfer bit values between the memory cells 102 of the selected row 104 and input/output buffers 126 (for write/read operations) or external input/output data buses 128. A column decoder 130 responsive to column address signals 132 can select which of the memory cells 102 within the selected row 104 is read out or written to. Alternatively, for read operations, the storage capacitors 112 within the row 104 may be read out simultaneously and latched, and the column decoder 130 can then select which latch bits to connect to the output data bus 128. Since read-out of the storage capacitors destroys the stored information, the read operation is accompanied by a simultaneous rewrite of the capacitor charge. Further, in between read/write operations, the capacitor charge is repeatedly refreshed to prevent data loss. Details of read/rewrite, write, and refresh operations are well-known to those of ordinary skill in the art.

The driving of an access line 116 may be at a higher voltage than the voltage of the address signals 122 received by the row decoder 122. Accordingly, a voltage level shifter may be used to convert the address signal from a first power domain to a second power domain. The use of a transition time reduction circuit, as described herein, may improve the responsiveness of the memory device 100, reduce the power consumption of the memory device 100, allow the memory device 100 to have a higher operating frequency, increase the rate of memory access from the memory device 100, or any suitable combination thereof.

The memory device 100 may be implemented as an integrated circuit within a package that includes pins for receiving supply voltages (e.g., to provide the source and gate voltages for the transistors 110) and signals (including data, address, and control signals). In general, it is to be understood that FIG. 1 depicts memory device 100 in drastically simplified form to illustrate basic structural components and principles of operation, omitting many details of the memory cells 102 and associated access and data lines 116, 118 as well as the peripheral circuitry. For example, in addition to the row and column decoders 120, 130, sense amplifier circuitry 124, and buffers 126, the memory device 100 may include further peripheral circuitry, such as a memory control unit that controls the memory operations based on control signals (provided, e.g., by an external processor), additional input/output circuitry, etc. Details of such peripheral circuitry are generally known to those of ordinary skill in the art and not further discussed herein. Instead, the following description focuses on structural details of the memory cells 102 and layout of the memory cell array in accordance with various embodiments.

In 2D DRAM arrays, the rows 104 and columns 106 of memory cells 102 are arranged along a single horizontal plane (i.e., a plane parallel to the layers) of the semiconductor substrate, e.g., in a rectangular lattice with mutually perpendicular horizontal access and data lines 116, 118. In 3D DRAM arrays, the memory cells 102 are arranged in a 3D lattice that encompasses multiple vertically stacked horizontal planes corresponding to multiple device tiers of a multi-tier substrate assembly, with each device tier including multiple parallel rows of cells 102 whose transistor gate terminals are connected by horizontal access lines 116. (A "device tier," as used herein, may include multiple layers (or levels) of materials, but forms the components of memory devices of a single horizontal tier of memory cells.) The data lines 118 extend vertically through all or at least a vertical portion of the multi-tier structure, and each data line 118 connects to the transistor source terminals of a vertical column 106 of associated memory cells 102 at the multiple device tiers. This 3D configuration of memory cells enables further increases in bit density compared with 2D arrays.

Figure 2:
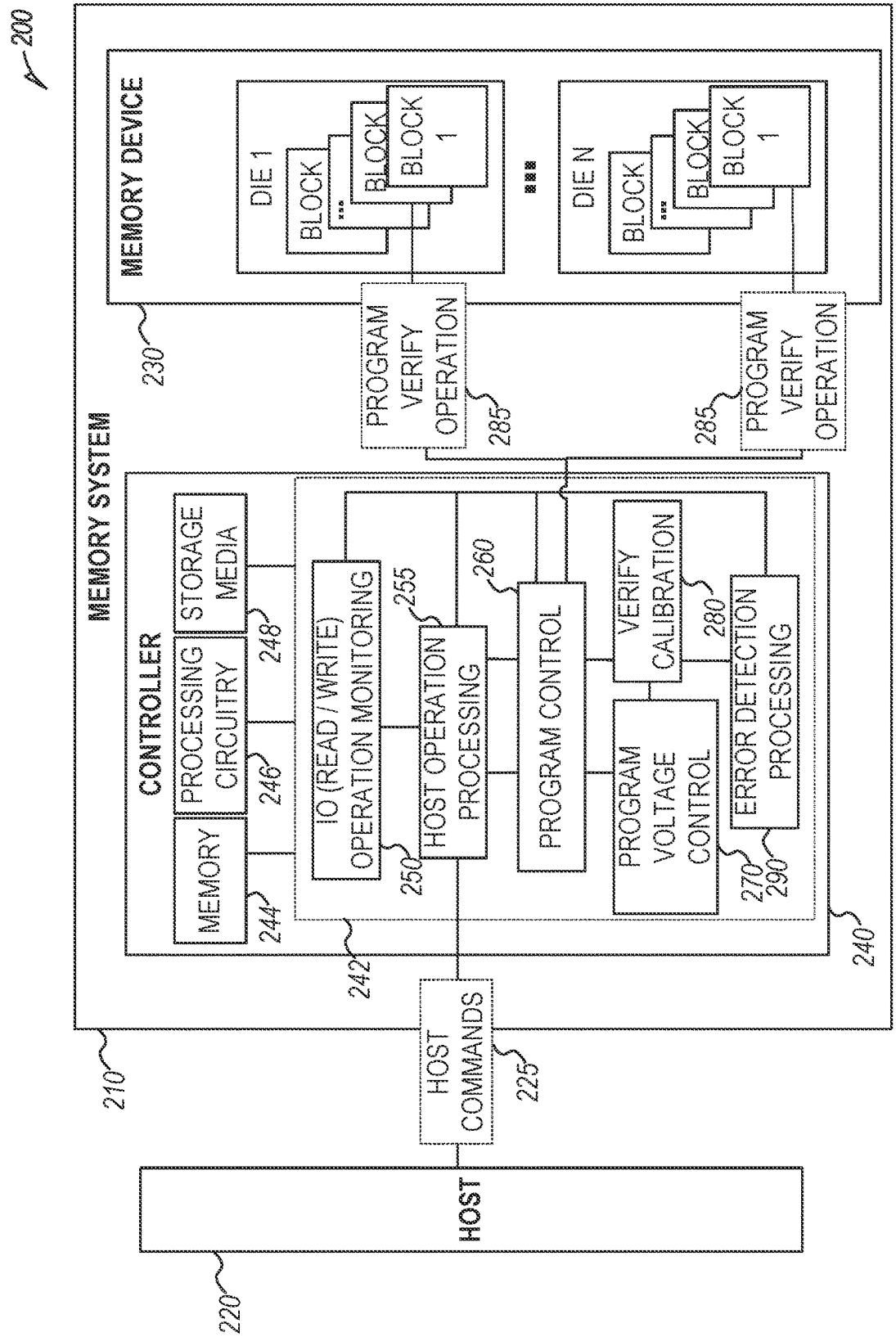
FIG. 2 is a block diagram of an example system including a memory device adapted for reducing program verifies for multi-level NAND cells.

FIG. 2 provides a block diagram of an example system 200 including a memory system 210 (e.g., a SSD storage device, a SD/MMC card, etc.) having a memory controller 240 and a memory device 230. In an example, the functionality of control modules 242 of the memory controller 240 may be implemented in respective modules in a firmware of the memory controller 240. However, it will be understood that various forms of software, firmware, and hardware may be utilized by the controller 240 to implement the control modules 242 (e.g., implement the functionality of program control 260) and the other techniques discussed herein.

As shown, the memory system 210 includes a NAND memory device 230 with multiple dies (dies 1-N), with each die including one or more blocks (blocks 1-N). Each of the one or more blocks may include further divided portions, such as one or more wordlines (not shown) per block; and each of the one or more wordlines may be further comprised of one or more pages (not shown) per wordline, depending on the number of data states that the memory cells of that wordline are configured to store.

Accessing data from the memory device 230 may comprise applying a read voltage to a wordline, wherein the voltage applied to the wordline is different than the signaling voltage used to indicate that the voltage should be applied. A voltage level shifter may be used to convert the signaling voltage in a first power domain to the read voltage in a second power domain. By using the transition time reduction techniques and circuits discussed herein, the transition time for applying or ceasing to apply the read voltage may be reduced, improving performance of the memory device 230 by reducing power consumption, increasing operating frequency, or both.

In an example, the blocks of memory cells of the memory device 230 include groups of at least one of: single-level cell (SLC), multi-layer cell (MLC), triple-layer cell (TLC), or quad-layer cell (QLC) NAND memory cells. Also, in an example, the memory device 230 is arranged into a stack of three-dimensional (3D) NAND dies. These configurations and further detailed components of the memory device 230 are not illustrated in FIG. 2 for simplicity. However, the memory device 230 may incorporate these or any of the features described above with reference to features of 3D NAND architecture devices or other forms of NAND storage devices.

In 3D architecture semiconductor memory technology, vertical structures are stacked, increasing the number of tiers, physical pages, and accordingly, the density of a memory device (e.g., a storage device). In an example, the memory system 210 can be a discrete memory or storage device component of the host device 220. In other examples, the memory system 210 can be a portion of an integrated circuit (e.g., system on a chip (SOC), etc.), stacked or otherwise included with one or more other components of the host device 220.

Each flash memory cell in a NAND architecture semiconductor memory array may be programmed to two or more programmed states. For example, an SLC may represent one of two programmed states (e.g., 1 or 0), representing one bit of data. Flash memory cells may also represent more than two programmed states, allowing the manufacture of higher density memories without increasing the number of memory cells, as each cell may represent more than one binary digit (e.g., more than one bit). Such cells may be referred to as multi-state memory cells, multi-digit cells, or multi-level cells (MLCs). In certain examples, MLC may refer to a memory cell that may store two bits of data per cell (e.g., one of four programmed states), TLC may refer to a memory cell that may store three bits of data per cell (e.g., one of eight programmed states), and a QLC may store four bits of data per cell. MLC is used herein in its broader context, to refer to any memory cell(s) that may store more than one bit of data per cell (i.e., that may represent more than two programmed states; thus, the term MLC is used herein in the broader context, to be generic to memory cells storing 2, 3, 4, or more bits of data per cell).

The memory system 210 is shown as being operably coupled to a host 220 via a controller 240 of the memory device. The controller 240 is adapted to receive and process host IO commands 225, such as read commands, write commands, erase commands, and the like, to read, write, erase, and manage data stored within the memory device 230. In other examples, the memory controller 240 may be physically separate from an individual memory device, and may receive and process commands for one or more individual memory devices. A variety of other components for the memory system 210 (such as a memory manager, and other circuitry or operational components) and the controller 240 are also not depicted for simplicity.

The controller 240 is depicted as including a memory 244 (e.g., volatile memory), processing circuitry 246 (e.g., a microprocessor), and a storage media 248 (e.g., non-volatile memory), used for executing instructions (e.g., instructions hosted by the storage media 248, loaded into memory 244, and executed by the processing circuitry 246) to implement the control modules 242 for management and use of the memory device 230. The functionality provided by the control modules 242 may include, but is not limited to: IO operation monitoring 250 (e.g., to monitor read and write IO operations, originating from host commands); host operation processing 255 (e.g., to interpret and process the host IO commands 225, and to issue further commands to the memory array 230 to perform respective read, write, erase, or other host-initiated operations); program control 260 (e.g., to control the timing, criteria, conditions, and parameters of respective program verify operations 285 on the memory device 230); program voltage control 270 (e.g., to establish, set, and utilize a program voltage level to program a particular portion of the memory device 230); verify calibration 280 (e.g., to operate a calibration procedure to identify a new programmed voltage level of a particular portion or portions of the memory device 230); and error detection processing 290 (e.g., to identify and correct errors from data obtained in read operations, to identify one or more raw bit error rates (RBER(s)) for a particular read operation or set of operations, etc.).

One or more communication interfaces can be used to transfer the host commands 225 between the memory system 210 and one or more other components of the host device 220, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 220 can include a host system, an electronic device, a processor, a memory card reader, or one or more other electronic devices external to the memory system 210. In some examples, the host device 220 may be a machine having some portion, or all, of the components discussed in reference to the machine 1000 of FIG. 10.

In an example, the host operation processing 255 is used to interpret and process the host IO commands 225 (e.g., read and write commands) and initiate accompanying commands in the controller 240 and the memory device 230 to accomplish the host IO commands 225. Further, the host operation processing 255 may coordinate timing, conditions, and parameters of the program control 260 in response to the host IO commands 225, IO operation monitoring 250, and error detection processing 290.

The IO operation monitoring 250 operates, in some example embodiments, to track reads and writes to the memory device 230 initiated by host IO commands. The IO operation monitoring 250 also operates to track accompanying IO operations and states, such as a host IO active or inactive state (e.g., where an active state corresponds to the state of the controller 240 and memory device 230 actively performing read or write IO operations initiated from the host 220, and where an inactive state corresponds to an absence of performing such IO operations initiated from the host 220). The IO operation monitoring 250 may also monitor voltage level and read error rates occurring with the IO operations initiated from the host 220, in connection with determining parameters for the program control 260 as discussed herein.

The program control 260 can include, among other things, circuitry or components (hardware and/or software) configured to control memory operations associated with writing data to, reading data from, or erasing one or more memory cells of the memory device 230 coupled to the memory controller 240. In an example, the program control 260 operates to identify parameters in the memory device 230 and controller 240 for scheduling and conducting a program verify operation 285, such as based on the IO conditions (e.g., indicated by the IO operation monitoring 250) or error conditions (e.g., indicated by the error detection processing 290). The program control 260 further operates to initiate and perform the program verify operation 285 based on these or other parameters, through synchronous or asynchronous event processing.

The program voltage control 270, in some example embodiments, is used to establish, change, and provide a voltage value used to program a particular area of memory (such as a respective block in the memory device 230). For example, the program voltage control 270 may implement various positive or negative offsets in order to program respective memory cells and memory locations (e.g., pages, blocks, dies) including the respective memory cells. A voltage level shifter may be used to transition control signals from a first power domain to control signals in a second power domain. The operating voltage of the second power domain may be controlled by the program voltage control 270. For example, a common ground may be used in the two power domains, a fixed voltage source used as the operating voltage of the first power domain, and the output of a voltage source, configured by the program voltage control 270, used as the operating voltage of the second power domain.

In an example, the verify calibration 280 is used to establish (e.g., change, update, reset, etc.) whether or not a verify operation should be performed after a program operation. The verify calibration 280 may be implemented based on a number or percentage of bits in the NAND memory device 230 that were successfully programmed at a lower voltage level.

The error detection processing 290, in some example embodiments, may detect a recoverable error condition (e.g., a RBER value or an RBER trend), an unrecoverable error condition, or other measurements or error conditions for a memory cell, a group of cells, or larger areas of the memory array (e.g., averages or samples from a block, group of blocks, die, group of dies, etc.).

Additionally, the sampling and read operations that are performed in a read scan by the program control 260 may allow configuration, such as from a specification (e.g., a determined setting or calculation) of: a size of data (e.g., data corresponding to a page, block, group of blocks, die) that is programmed; a number of pages in total that are programmed; a number of pages within a block that are programmed; whether certain cells, pages, blocks, dies, or certain types of such cells, pages, blocks, dies are or are not programmed; and the like. Likewise, the program control 260 may control or allow configuration of the number of program cycles that are performed before the first verify cycle, the number of program cycles that are performed between verify cycles, the number of bits to be successfully programmed at each level before next-level verification begins, or any suitable combination thereof.

In addition to the techniques discussed herein, other types of maintenance operations may be implemented by the control modules 242 in the controller 240. Such operations may include garbage collection or reclamation, wear leveling, block management, and other forms of background activities performed upon the memory device 230. Such background activities may be triggered during an idle state detected by the IO operation monitoring 250, such as immediately following or concurrently with a read scan operation.

The program control 260 can include an error correction code (ECC) component, which can include, among other things, an ECC engine or other circuitry configured to detect or correct errors associated with writing data to or reading data from one or more memory cells of the memory device 230 coupled to the memory controller 240. The memory controller 240 can be configured to actively detect and recover from error occurrences (e.g., bit errors, operation errors, etc.) associated with various operations or storage of data, while maintaining integrity of the data transferred between the host device 220 and the memory system 210, or maintaining integrity of stored data (e.g., using redundant RAID storage, etc.), and can remove (e.g., retire) failing memory resources (e.g., memory cells, memory arrays, pages, blocks, etc.) to prevent future errors.

The memory device 230 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the memory system 210 in pages, and erased in blocks. However, one or more memory operations (e.g., read, write, erase, etc.) can be performed on larger or smaller groups of memory cells, as desired. The data transfer size of a NAND memory system 210 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory devices 230 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

Figure 3:
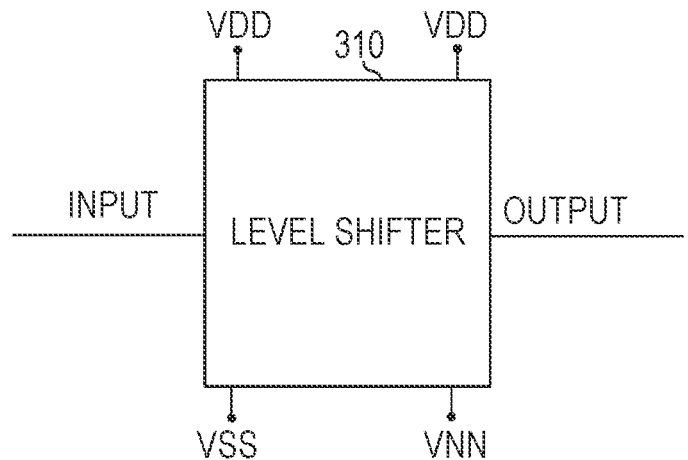
FIG. 3 illustrates generally examples of level shifters, according to an embodiment.
Figure 3:
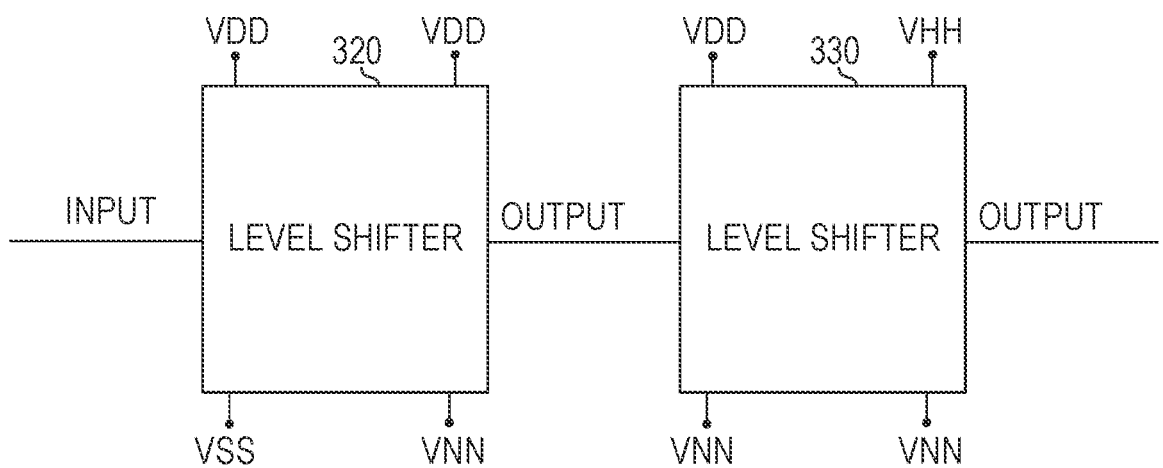

FIG. 3 illustrates generally examples of level shifters 310, 320, and 330, according to an embodiment. The level shifter 310 receives an input signal in the range of $V_{DD}$ to $V_{SS}$ and generates an output signal in the range of $V_{DD}$ to $V_{NN}$. Thus, the level shifter 310 changes the lower operating voltage from $V_{SS}$ to $V_{NN}$, but leaves the upper operating voltage unchanged.

The level shifter 320 is similar to the level shifter 310, but the output from the level shifter 320 is provided to another level shifter 330. The level shifter 330 receives an input signal in the range of $V_{DD}$ to $V_{NN}$ and generates an output signal in the range of $V_{HH}$ to $V_{NN}$. Thus, the level shifter 310 changes the upper operating voltage from $V_{DD}$ to $V_{HH}$, but leaves the lower operating voltage unchanged. By operating the level shifter 320 and the level shifter 330 in series, as shown in FIG. 3, both the upper and lower operating voltage levels are shifted. Alternatively, the level shifter 330 can operate alone when an input signal in the range of $V_{DD}$ to $V_{SS}$ is needed to be shifted into the output range $V_{HH}$ to $V_{SS}$.

Figure 4:
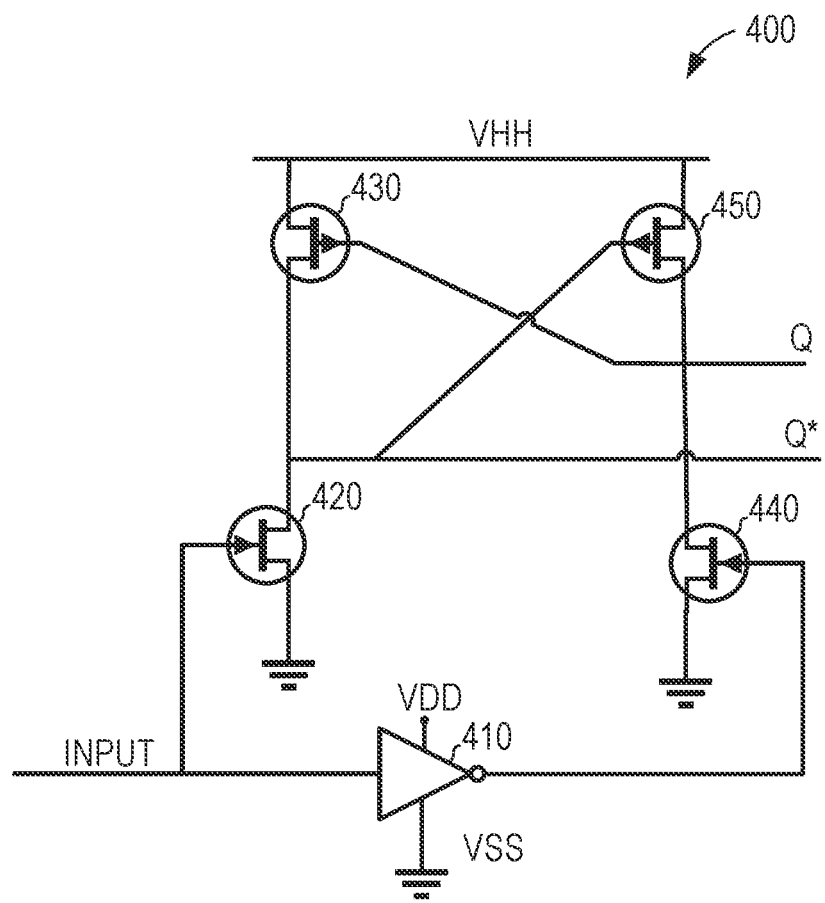
FIG. 4 illustrates generally an example level shifter circuit, according to an embodiment.

FIG. 4 illustrates generally an example level shifter circuit 400, according to an embodiment (e.g., an implementation of the level shifter 330). The level shifter circuit 400 includes an inverter 410, n-type transistors 420 and 440, and p-type transistors 430 and 450. The input provides a signal in the range $V_{DD}$ to $V_{SS}$. The primary output, Q, is in the range $V_{HH}$ to $V_{SS}$. The complementary output, Q*, is in the same voltage range but has the inverted value of Q in the steady-state. The transition time of Q and Q* may not be identical, and thus Q* will not necessarily be equal to the inverted value of Q during transition from one binary value to another.

When the input is high, the transistor 420 acts as a conductor. Thus, Q* is connected via the transistor 420 to ground, and generates the inverse, low, output signal. The low signal on Q* activates the transistor 450, pulling Q up to $V_{HH}$ and causing the transistor 430 to act as an open circuit, preventing Q* from being connected via the transistor 430 to $V_{HH}$. The output of the inverter 410 is low, causing the transistor 440 to act as an open circuit, preventing Q from being connected via the transistor 440 to ground.

When the input is low, the transistor 420 acts as an open circuit. The output of the inverter 410 is high, causing the transistor 440 to act as a conductor, causing Q to be connected via the transistor 440 to ground and generating a low output signal. When Q is low, the transistor 430 becomes a conductor, connecting Q* to $V_{HH}$. When Q* is high, the transistor 450 acts as an open circuit, preventing Q from being connected via the transistor 450 to $V_{HH}$.

As can be seen in the level shifter circuit 400, the output voltages vary between $V_{HH}$ and ground ($V_{SS}$). The transistors 420 and 440 are controlled by voltages in the input power domain, the inverter 410 operates in the input power domain, and the transistors 430 and 450 are controlled by voltages in the output power domain.

Figure 5:
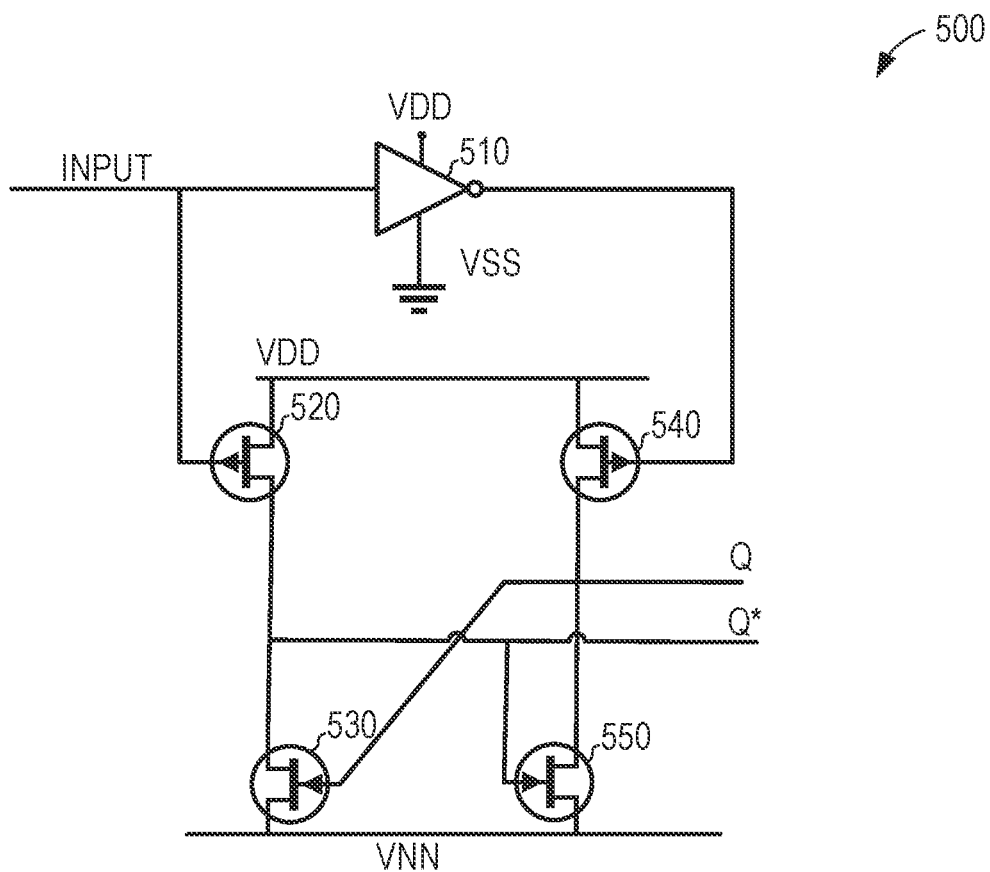
FIG. 5 illustrates generally an example level shifter circuit, according to an embodiment.

FIG. 5 illustrates generally an example level shifter circuit 500, according to an embodiment (e.g., an implementation of the level shifter 310 or 320). The level shifter circuit 500 includes an inverter 510, n-type transistors 530 and 550, and p-type transistors 520 and 540. The input provides a signal in the range $V_{DD}$ to $V_{SS}$. The primary output, Q, is in the range $V_{DD}$ to $V_{NN}$. The complementary output, Q*, is in the same voltage range but has the inverted value of Q in the steady-state. The transition time of Q and Q* may not be identical, and thus Q* will not necessarily be equal to the inverted value of Q during transition from one binary value to another.

When the input is low, the transistor 520 acts as a conductor. Thus, Q* is connected via the transistor 520 to $V_{DD}$, and generates the inverse, high, output signal. The high signal on Q* activates the transistor 550, pulling Q down to $V_{NN}$ and causing the transistor 530 to act as an open circuit, preventing Q* from being connected via the transistor 530 to $V_{NN}$. The output of the inverter 510 is high, causing the transistor 540 to act as an open circuit, preventing Q from being connected via the transistor 540 to $V_{DD}$.

When the input is high, the transistor 520 acts as an open circuit. The output of the inverter 510 is low, causing the transistor 540 to act as a conductor, causing Q to be connected via the transistor 540 to $V_{DD}$ and generating a high output signal. When Q is high, the transistor 530 becomes a conductor, connecting Q* to $V_{NN}$. When Q* is low, the transistor 550 acts as an open circuit, preventing Q from being connected via the transistor 550 to $V_{NN}$.

As can be seen in the level shifter circuit 500, the output voltages vary between $V_{DD}$ and $V_{NN}$. The transistors 520 and 540 are controlled by voltages in the input power domain, the inverter 510 operates in the input power domain, and the transistors 530 and 550 are controlled by voltages in the output power domain.

While the structure of the level shifter circuit 400 differs from the structure of the level shifter circuit 500, both of the level shifter circuits 400-500 receive an input (e.g., an output of a first assembly). Additionally, both of the level shifter circuits 400-500 comprise a first inverter (410, 510) that operates in the first power domain and is coupled to the input. The level shifter circuits 400-500 further comprise a first transistor (420, 520) coupled to the output of the first assembly and a first output of the level shifter circuit 400-500 (Q*), the first output of the level shifter assembly operating in the second power domain. The level shifter circuits 400-500 further comprise a second transistor (440, 540) coupled to an output of the first inverter and a second output (Q) of the level shifter circuit, the second output of the level shifter assembly operating in the second power domain.

Level shifters 400 and 500 may be modified with the addition of other components (e.g., cascode-type transistors) inserted within the two totem-poles branches of the level shifters 400-500 to prevent damage and degradation of the transistors 420-440 and 520-540, to ease the sizing of the transistors 420-440 and 520-540, or any suitable combination thereof. In some example embodiments, the pair of low power domain gate driven transistors (420, 440 or 520, 540) are larger to counteract the enhanced conductivity of the high power domain gate driven transistors (430, 450 or 530, 550).

Though the level shifter circuits 400-500 are described as circuits, other assemblies may be used. For example, a PCB assembly is a finished circuit board that includes connection hardware, mounting hardware, discrete components, or any suitable combination thereof. A PCB may include multiple circuits. As another example, a housing may surround the level shifter circuit 400 or 500 to form a level shifter assembly.

Figure 6:
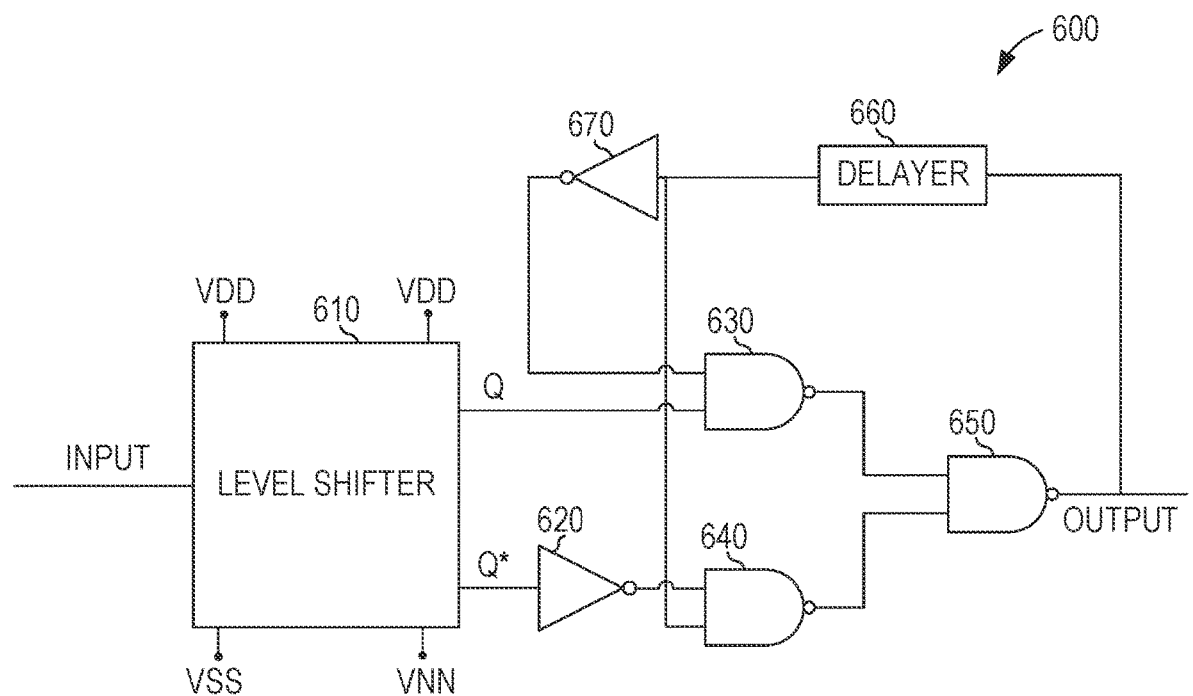
FIG. 6 illustrates an example of a ramp reduction circuit coupled to a level shifter, according to an embodiment.

FIG. 6 illustrates an example of a ramp selection circuit 600 coupled to a level shifter 610, according to an embodiment. The ramp selection circuit 600 includes inverters 620 and 670, NAND gates 630, 640, and 650, and a delayer 660. The delayer 660 is configured to replicate the output with a predetermined delay period that is equal to or greater than the longest transition time of Q and Q* (e.g., 10% longer than the longest transition time). Specifically, FIG. 6 refers to a level shifter whose slowest output transition is the high to low one. With complementary considerations what follows is suitable to a level shifter whose slowest output transition is the low to high one.

During steady-state operation, the input Q* to the ramp selection circuit 600 is the inverse of the input Q. Thus, the output of the inverter 620 is the same as the input Q. During steady-state operation, the output of the delayer 660 is the same as the output of the NAND gate 650 and the output of the inverter 670 is the opposite. Thus, as shown by the truth table below, in steady-state operation, the output of the ramp selection circuit 600 is the same as the input Q (or the inverse of the input Q*).

| Input | Q | Q* | Q* INV | DELAYER | DELAYER INVERTED | OUTPUT OF NAND GATE 630 | OUTPUT OF NAND GATE 640 | OUTPUT |
|---|---|---|---|---|---|---|---|---|
| 0 | 0 | 1 | 0 | 0 | 1 | 1 | 1 | 0 |
| 1 | 1 | 0 | 1 | 1 | 0 | 1 | 0 | 1 |

When the input transitions from a first level to a second level, the delayer 660 continues to output the first level for a predetermined period of time. During the steady state, the input Q to the NAND gate 630 and the inverse Q* input to the NAND gate 640 are the same. However, during a low-to-high input transition, Q transitions (low-to-high) more quickly than Q* (high-to-low) and in a high-to-low input transition, Q* transitions (low-to-high) more quickly than Q (high-to-low). By use of the ramp selection circuit 600, the output signal transitions as soon as the faster of Q or Q* transitions, resulting in the selection of whichever signal transitions more quickly. Thus, the truth table below shows the results when Q has transitioned from 0 to 1 but Q* has not yet changed and when Q* has transitioned from 0 to 1 (so that Q* inverted has transitioned from 1 to 0) but Q has not yet changed.

| Input | Q | Q* | Q* INV | DELAYER | DELAYER INVERTED | OUTPUT OF NAND GATE 630 | OUTPUT OF NAND GATE 640 | OUTPUT |
|---|---|---|---|---|---|---|---|---|
| 0 → 1 | 1f | 1s | 0 | 0t | 1 | 0 | 1 | 1 |
| 1 → 0 | 1s | 1f | 0 | 1t | 0 | 1 | 1 | 0 | f = fast transition; s = temporarily because slow transition, t = for t seconds

Figure 7:
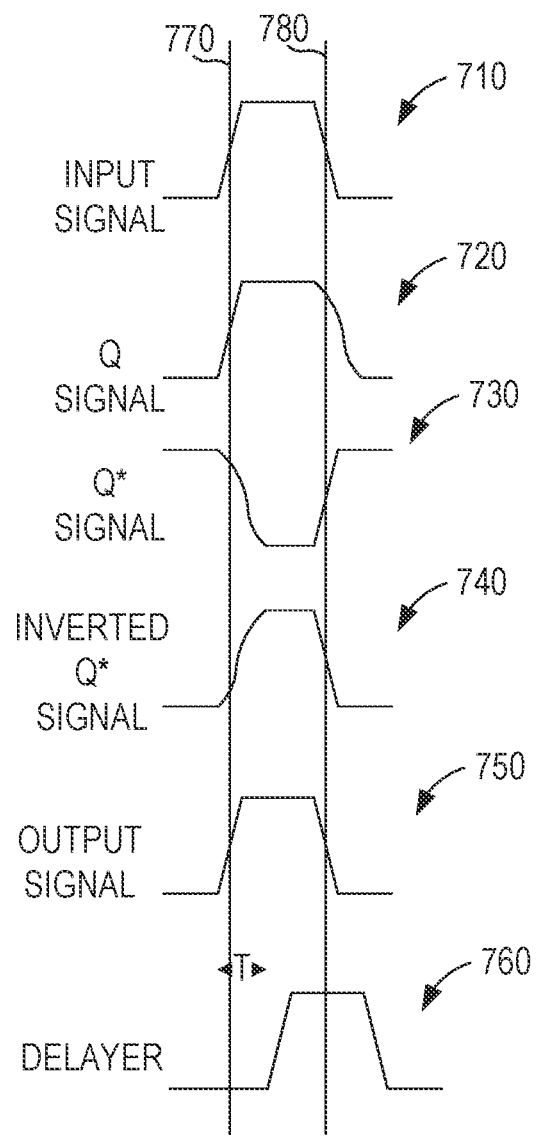
FIG. 7 illustrates example input, output, and intermediate waveforms, according to an embodiment.

FIG. 7 illustrates example input waveform 710, output waveform 750, intermediate waveforms 720, 730, and 740, and delayer waveform 760, according to an embodiment. Also shown are time points 770 and 780, corresponding to the transition times of the input waveform 710. The input waveform 710 corresponds to the input to the level shifter 610 of FIG. 6. The input is low ($V_{SS}$) for a first time period, high ($V_{DD}$) for a second time period, and low for a third time period. The transitions between low and high voltage are (relatively) symmetrical.

The intermediate waveform 720 corresponds to the output Q from the level shifter 610 of FIG. 6. Q is low ($V_{NN}$) for a first time period, high ($V_{DD}$) for a second time period, and low for a third time period. The transition from low to high (between the first and second time periods) is faster than the transition from high to low (between the second and third time periods).

The intermediate waveform 730 corresponds to the output Q* from the level shifter 610 of FIG. 6. Q* is high ($V_{DD}$) for a first time period, low ($V_{NN}$) for a second time period, and high for a third time period. The transition from high to low (between the first and second time periods) is slower than the transition from low to high (between the second and third time periods).

The intermediate waveform 740 corresponds to the inverted Q* signal output by the inverter 620 of FIG. 6. The intermediate waveform 740 is the inverse of the intermediate waveform 730. As seen in FIG. 7, the inverted Q* signal of the intermediate waveform 740 has transitions that differ in transition time than the Q signal shown in the intermediate waveform 720. Thus, at the time point 770, the input waveform 710 and the intermediate waveform 720 are at the transition voltage but the intermediate waveform 740 has not yet reached the transition voltage. Conversely, at the time point 780, the input waveform 710 and the intermediate waveform 740 are at the transition voltage but the intermediate waveform 720 has not yet reached the transition voltage.

The output waveform 750 corresponds to the output of the ramp selection circuit 600 of FIG. 6. The output is low ($V_{NN}$) for a first time period, high ($V_{DD}$) for a second time period, and low for a third time period. The transitions between low and high voltage are symmetrical even though none of the intermediate waveforms 720-740 have symmetrical transitions.

The delayer waveform 760 corresponds to the output of the delayer 660 of FIG. 6. The delayer waveform 760 is the same as the output waveform 750, delayed by a predetermined time period t. The time period t is equal to or greater than the longest transition time of the intermediate waveforms 720-740. Thus, during transition, the delayer waveform 760 maintains the pre-transition voltage value and, during steady-state operation, the voltage of the delayer waveform 760 is the same as that of the output waveform 750.

By comparison with intermediate waveform 720 corresponding to the Q output from the level shifter 610, the output waveform 750 is delayed by the propagation times of the inverter 620 and the NAND gates 630-650. However, since the propagation of time of these simple elements is very much faster (e.g., two or three orders of magnitude lower) than the switching times of the transistors used in the level shifter 610, the additional propagation delay is negligible.

Figure 8:
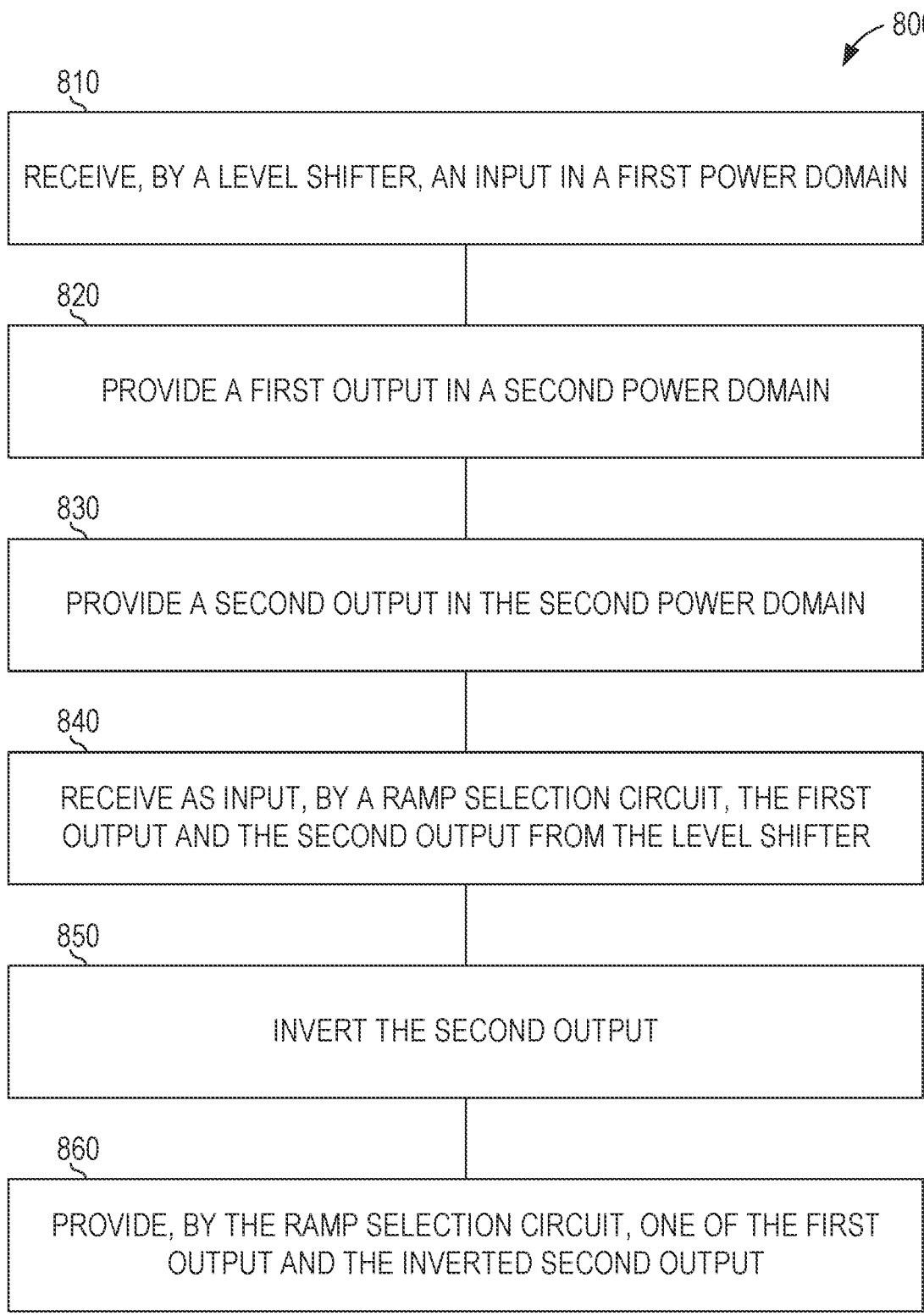
FIG. 8 is a flow chart showing operations of a method performed by a circuit in performing voltage level transition time reduction, in accordance with some embodiments of the present disclosure.

FIG. 8 is a flow chart showing operations of a method 800 performed by a semiconductor device (e.g., a memory device) in performing voltage level transition time reduction, in accordance with some embodiments of the present disclosure. The method 800 includes steps 810, 820, 830, 840, 850, and 860. By way of example and not limitation, the method 800 is described as being performed by the level shifter 610 and the ramp selection circuit 600 of FIG. 6.

In step 810, the level shifter 610 receives an input in a first power domain. The level shifter 610 provides a first output (e.g., Q) and a second output (e.g., Q*) in a second power domain (steps 820 and 830). In the steady state, the second output may be the inverse of the first output, but the two outputs may be logically equivalent during transition from one binary state to another.

In step 840, the ramp selection circuit 600 receives as input the first output and the second output from the level shifter 610. The ramp selection circuit 600, in step 850, inverts the second output (e.g., using the inverter 620).

The ramp selection circuit, in step 860, provides either the first output or the inverted second output (i.e., by use of the NAND gates 630-650, delayer 660, and inverter 670). The provided output may be a conversion of the input received in step 810 to the second power domain with a lower average transition time than either of the two outputs received from the level shifter 610.

Figure 9:
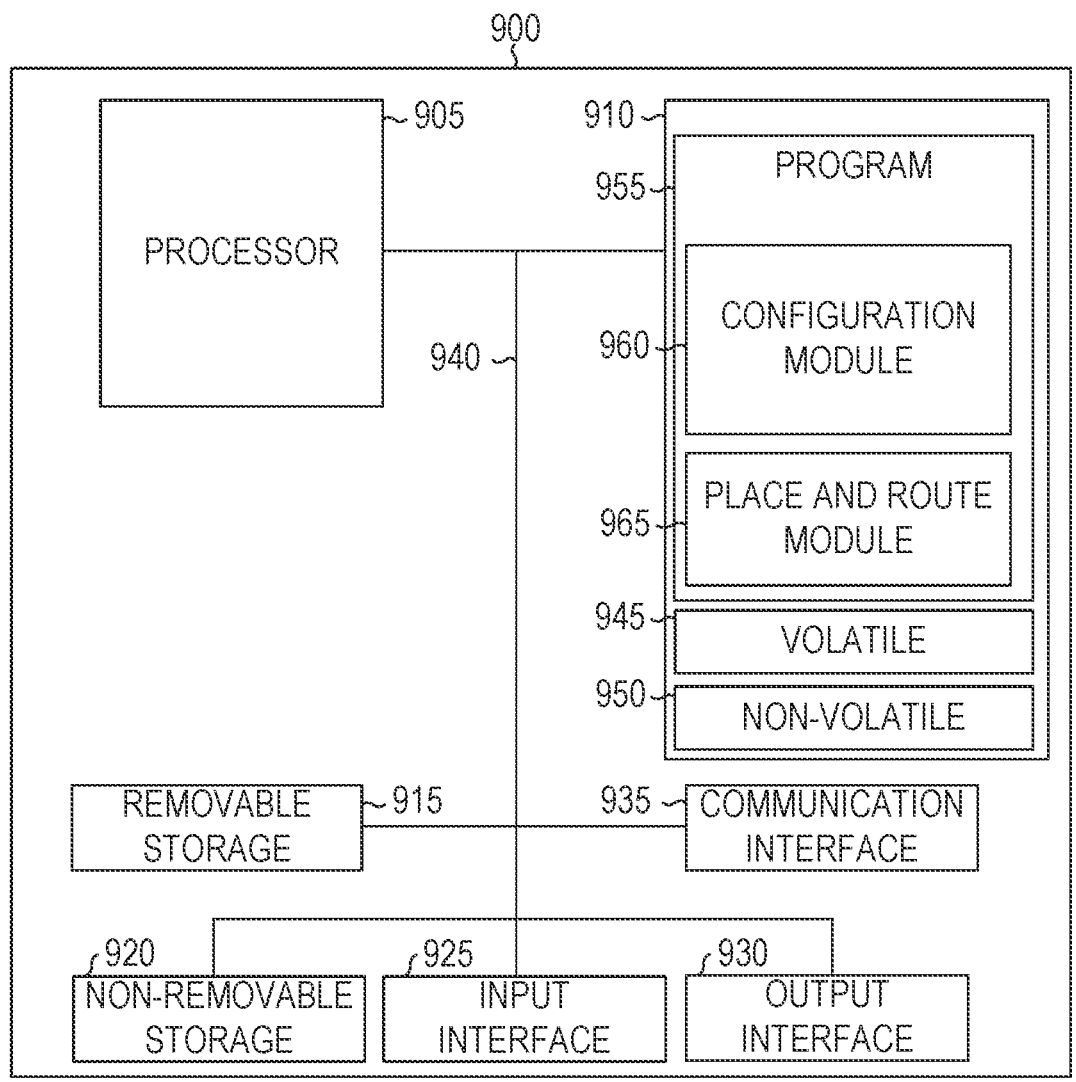
FIG. 9 is a block diagram illustrating components of a system that configures an integrated circuit, according to some example embodiments.

FIG. 9 is a block diagram illustrating components of a computer 900 that controls fabrication of a semiconductor device (e.g., an integrated circuit), according to some example embodiments. All components need not be used in various embodiments. For example, clients, servers, autonomous systems, and cloud-based network resources may each use a different set of components, or, in the case of servers for example, larger storage devices.

One example computing device in the form of a computer 900 (also referred to as computing device 900 and computer system 900) may include a processor 905, memory storage 910, removable storage 915, and non-removable storage 920, all connected by a bus 940. Although the example computing device is illustrated and described as the computer 900, the computing device may be in different forms in different embodiments. For example, the computing device may instead be a smartphone, a tablet, a smartwatch, or another computing device including elements the same as or similar to those illustrated and described with regard to FIG. 9. Devices such as smartphones, tablets, and smartwatches are collectively referred to as "mobile devices." Further, although the various data storage elements are illustrated as part of the computer 900, the storage may also or alternatively include cloud-based storage accessible via a network, such as the Internet, or server-based storage.

The memory storage 910 may include volatile memory 945 and non-volatile memory 950, and may store a program 955. The computer 900 may include, or have access to, a computing environment that includes a variety of computer-readable media, such as the volatile memory 945; the non-volatile memory 950; the removable storage 915; and the non-removable storage 920. Computer storage includes random-access memory (RAM), read-only memory (ROM), erasable programmable read-only memory (EPROM) and electrically erasable programmable read-only memory (EEPROM), flash memory or other memory technologies, compact disc read-only memory (CD ROM), digital versatile disks (DVD) or other optical disk storage, magnetic cassettes, magnetic tape, magnetic disk storage or other magnetic storage devices, or any other medium capable of storing computer-readable instructions.

The computer 900 may include or have access to a computing environment that includes an input interface 925, an output interface 930, and a communication interface 935. The output interface 930 may interface to or include a display device, such as a touchscreen, that also may serve as an input device. The input interface 925 may interface to or include one or more of a touchscreen, a touchpad, a mouse, a keyboard, a camera, one or more device-specific buttons, one or more sensors integrated within or coupled via wired or wireless data connections to the computer 900, and other input devices. The computer 900 may operate in a networked environment using the communication interface 935 to connect to one or more remote computers, such as database servers. The remote computer may include a personal computer (PC), server, router, network PC, peer device or other common network node, or the like. The communication interlace 935 may connect to a local-area network (LAN), a wide-area network (WAN), a cellular network, a WiFi network, a Bluetooth network, or other networks.

Computer instructions stored on a computer-readable medium (e.g., the program 955 stored in the memory storage 910) are executable by the processor 105 of the computer 900. A hard drive, CD-ROM, and RAM are some examples of articles including a non-transitory computer-readable medium such as a storage device. The terms "computer-readable medium" and "storage device" do not include carrier waves to the extent that carrier waves are deemed too transitory. "Computer-readable non-transitory media" includes all types of computer-readable media, including magnetic storage media, optical storage media, flash media, and solid-state storage media. It should be understood that software can be installed in and sold with a computer. Alternatively, the software can be obtained and loaded into the computer, including obtaining the software through a physical medium or distribution system, including, for example, from a server owned by the software creator or from a server not owned but used by the software creator. The software can be stored on a server for distribution over the Internet, for example.

The program 955 is shown as including a configuration module 960 and a place and route module 965. Any one or more of the modules described herein may be implemented using hardware (e.g., a processor of a machine, an application-specific integrated circuit (ASIC), an FPGA, or any suitable combination thereof). Moreover, any two or more of these modules may be combined into a single module, and the functions described herein for a single module may be subdivided among multiple modules. Furthermore, according to various example embodiments, modules described herein as being implemented within a single machine, database, or device may be distributed across multiple machines, databases, or devices.

The configuration module 960 provides a user interface to allow a user to provide a configuration for an integrated circuit. For example, the user interface may allow the user to identify a hardware design language (HDL) file that specifies the configuration.

The place and route module 965 fabricates the integrated circuit based on the configuration. For example, the place and route module 965 may control the fabrication of a photomask that is used to control photolithography of a prepared semiconductor wafer.

Figure 10:
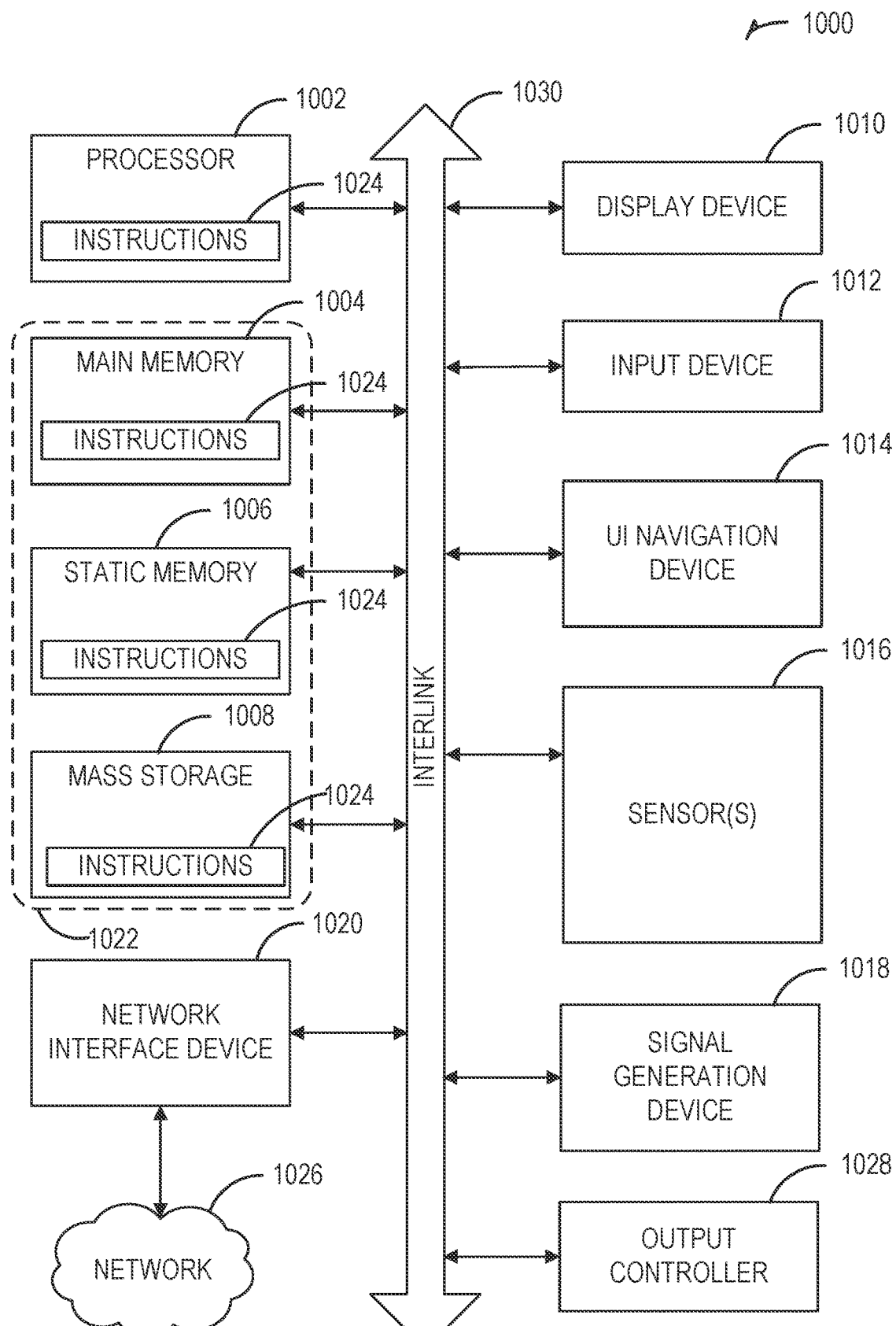
FIG. 10 illustrates a block diagram of an example machine with which, in which, or by which any one or more of the techniques (e.g., methodologies) discussed herein can be implemented.

FIG. 10 illustrates a block diagram of an example machine 1000 with which, in which, or by which any one or more of the techniques (e.g., methodologies) discussed herein can be implemented. Examples, as described herein, can include, or can operate by, logic or a number of components, or mechanisms in the machine 1000. Circuitry (e.g., processing circuitry) is a collection of circuits implemented in tangible entities of the machine 1000 that include hardware (e.g., simple circuits, gates, logic, etc.). Circuitry membership can be flexible over time. Circuitries include members that can, alone or in combination, perform specified operations when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a machine-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine-readable medium elements are part of the circuitry or are communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time. Additional examples of these components with respect to the machine 1000.

In alternative embodiments, the machine 1000 can operate as a standalone device or can be connected (e.g., networked) to other machines. In a networked deployment, the machine 1000 can operate in the capacity of a server machine, a client machine, or both in server-client network environments. In an example, the machine 1000 can act as a peer machine in peer-to-peer (P2P) (or other distributed) network environment. The machine 1000 can be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine 1000 (e.g., computer system) can include a hardware processor 1002 (e.g., a central processing unit (CPU), a graphics processing unit (GPU), a hardware processor core, or any combination thereof), a main memory 1004, a static memory 1006 (e.g., memory or storage for firmware, microcode, a basic-input-output (BIOS), unified extensible firmware interface (UEFI), etc.), and mass storage device 1008 (e.g., hard drives, tape drives, flash storage, or other block devices), some or all of which can communicate with each other via an interlink 1030 (e.g., bus). The machine 1000 can further include a display device 1010, an alphanumeric input device 1012 (e.g., a keyboard), and a user interface (UI) navigation device 1014 (e.g., a mouse). In an example, the display device 1010, the input device 1012, and the UI navigation device 1014 can be a touch screen display. The machine 1000 can additionally include a signal generation device 1018 (e.g., a speaker), a network interface device 1020, and one or more sensor(s) 1016, such as a global positioning system (GPS) sensor, compass, accelerometer, or other sensor. The machine 1000 can include an output controller 1028, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the hardware processor 1002, the main memory 1004, the static memory 1006, or the mass storage device 1008 can be, or include, a machine-readable medium 1022 on which is stored one or more sets of data structures or instructions 1024 (e.g., software) embodying or used by any one or more of the techniques or functions described herein. The instructions 1024 can also reside, completely or at least partially, within any of registers of the hardware processor 1002, the main memory 1004, the static memory 1006, or the mass storage device 1008 during execution thereof by the machine 1000. In an example, one or any combination of the hardware processor 1002, the main memory 1004, the static memory 1006, or the mass storage device 1008 can constitute the machine-readable medium 1022. While the machine-readable medium 1022 is illustrated as a single medium, the term "machine-readable medium" can include a single medium or multiple media (e.g., a centralized or distributed database, or associated caches and servers) configured to store the one or more instructions 1024.

The term "machine readable medium" can include any medium that is capable of storing, encoding, or carrying instructions for execution by the machine 1000 and that cause the machine 1000 to perform any one or more of the techniques of the present disclosure, or that is capable of storing, encoding, or carrying data structures used by or associated with such instructions. Non-limiting machine-readable medium examples can include solid-state memories, optical media, magnetic media, and signals (e.g., radio frequency signals, other photon-based signals, sound signals, etc.). In an example, a non-transitory machine-readable medium comprises a machine-readable medium with a plurality of particles having invariant (e.g., rest) mass, and thus are compositions of matter. Accordingly, non-transitory machine-readable media are machine readable media that do not include transitory propagating signals. Specific examples of non-transitory machine readable media can include: non-volatile memory, such as semiconductor memory devices (e.g., electrically programmable read-only memory (EPROM), electrically erasable programmable read-only memory (EEPROM)) and flash memory devices; magnetic disks, such as internal hard disks and removable disks; magneto-optical disks; and CD-ROM and DVD-ROM disks.

In an example, information stored or otherwise provided on the machine-readable medium 1022 can be representative of the instructions 1024, such as instructions 1024 themselves or a format from which the instructions 1024 can be derived. This format horn which the instructions 1024 can be derived can include source code, encoded instructions (e.g., in compressed or encrypted form), packaged instructions (e.g., split into multiple packages), or the like. The information representative of the instructions 1024 in the machine-readable medium 1022 can be processed by processing circuitry into the instructions to implement any of the operations discussed herein. For example, deriving the instructions 1024 from the information (e.g., processing by the processing circuitry) can include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 1024.

In an example, the derivation of the instructions 1024 can include assembly, compilation, or interpretation of the information (e.g., by the processing circuitry) to create the instructions 1024 from some intermediate or preprocessed format provided by the machine-readable medium 1022. The information, when provided in multiple parts, can be combined, unpacked, and modified to create the instructions 1024. For example, the information can be in multiple compressed source code packages (or object code, or binary executable code, etc.) on one or several remote servers. The source code packages can be encrypted when in transit over a network and decrypted, uncompressed, assembled (e.g., linked) if necessary, compiled or interpreted (e.g., into a library, stand-alone executable etc.) at a local machine, and executed by the local machine.

The instructions 1024 can be further transmitted or received over a communications network 1026 using a transmission medium via the network interface device 1020 utilizing any one of a number of transfer protocols (e.g., frame relay, internet protocol, transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), plain old telephone (POTS) networks, and wireless data networks (e.g., Institute of Electrical and Electronics Engineers (IEEE) 802.11 family of standards known as Wi-Fi®, IEEE 802.16 family of standards known as WiMax®). IEEE 802.15.4 family of standards, peer-to-peer (P2P) networks, among others. In an example, the network interface device 1020 can include one or more physical jacks (e.g., Ethernet, coaxial, or phone jacks) or one or more antennas to connect to the network 1026. In an example, the network interface device 1020 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 1000, and includes digital or analog communications signals or other intangible medium to facilitate communication of such software. A transmission medium is a machine readable medium.

A level shifter may be used within the machine 1000 to provide binary signals in different voltage ranges to different components. For example, the processor 1002 may operate in a first power domain, the interlink 1030 in a second power domain, the main memory 1004 in a third power domain, the static memory 1006 in a fourth power domain, the mass storage device 1008 in a fifth power domain, the network interface device 1020 in a sixth power domain, and so on. Accordingly, a level shifter (or pair of level shifters, one for input and one for output) may be placed between any two components operating in different power domains. Using the systems and methods described herein, the transition times of the output signals from the level shifters are reduced, allowing for more efficient operation of the components of the machine 1000, higher clock speeds, or any suitable combination thereof.

To better illustrate the methods and apparatuses described herein, a non-limiting set of Example embodiments are set forth below as numerically identified Examples.

Example 1 is a circuit comprising: a level shifter that: receives an input in a first power domain; provides a first output in a second power domain; and provides a second output in the second power domain; and a ramp selection circuit that: receives as input the first output and the second output from the level shifter; inverts the second output; and provides one of the first output and the inverted second output as an output of the ramp selection circuit.

In Example 2, the subject matter of Example 1 includes, wherein: the ramp selection circuit comprises a delay circuit that receives, as input, the output of the ramp selection circuit; and the ramp selection circuit selects the provided one of the first output and the inverted second output based on an output of the delay circuit.

In Example 3, the subject matter of Example 2 includes, wherein the delay circuit provides, as output, the input of the delay circuit delayed by a predetermined period of time.

In Example 4, the subject matter of Example 3 includes, wherein the ramp selection circuit comprises a NAND gate that takes, as input, an inverted output from the delay circuit and the first output of the level shifter.

In Example 5, the subject matter of Examples 3-4 includes, wherein the ramp selection circuit comprises a NAND gate that takes, as input, the output of the delay circuit and the inverted second output of the level shifter.

In Example 6, the subject matter of Examples 1-5 includes, wherein: the input in the first power domain comprises a binary signal; a steady-state output of the first output comprises the binary signal in the second power domain; and a steady-state output of the second output comprises the inverse of the binary signal in the second power domain.

In Example 7, the subject matter of Example 6 includes, wherein: in response to a transition of the input binary signal from a first state to a second state in the first power domain: the first output transitions, over a first time period, from the first state to the second state in the second power domain; and the second output transitions, over a second time period, from the second state to the first state in the second power domain.

In Example 8, the subject platter of Example 7 includes, wherein: the first time period is not equal to the second time period.

In Example 9, the subject matter of Example 8 includes, wherein: in response to the transition of the input binary signal from the first state to the second state in the first power domain: the output of the ramp selection circuit transitions, over a third time period, from the first state to the second state in the second power domain, the third time period being the shorter of the first time period and the second time period.

In Example 10, the subject matter of Example 9 includes, wherein: the ramp selection circuit selects the provided one of the first output and the inverted second output based on the first time period and the second time period.

In Example 11, the subject matter of Examples 7-10 includes, wherein the delay circuit provides, as output, the input of the delay circuit delayed by at least the longer of the first time period and the second time period.

Example 12 is a method comprising: receiving, by a level shifter, an input in a first power domain; providing, by the level shifter, a first output in a second power domain; providing, by the level shifter, a second output in the second power domain; receiving as input, by a ramp selection circuit, the first output and the second output from the level shifter; inverting, by the ramp selection circuit, the second output; and providing, by the ramp selection circuit, one of the first output and the inverted second output as an output.

In Example 13, the subject matter of Example 12 includes, receiving as input, by a delay circuit component of the ramp selection circuit, the output of the ramp selection circuit; and selecting, by the ramp selection circuit, the one of the first output and the inverted second output based on an output of the delay circuit component.

In Example 14, the subject matter of Example 13 includes, providing as output, by the delay circuit, the input of the delay circuit delayed by a predetermined period of time.

In Example 15, the subject matter of Example 14 includes, receiving as input, by a NAND gate component of the ramp selection circuit, an inverted output from the delay circuit and the first output of the level shifter.

In Example 16, the subject matter of Examples 14-15 includes, receiving as input, by a NAND gate component of the ramp selection circuit, the output of the delay circuit and the inverted second output of the level shifter.

In Example 17, the subject matter of Examples 12-16 includes, wherein: the receiving of the input in the first power domain comprises receiving a binary signal; the providing of the first output in the second power domain comprises, in a steady state, providing the binary signal in the second power domain; and the providing of the second output in the second power domain comprises, in a steady state, providing an inverse of the binary signal in the second power domain.

In Example 18, the subject matter of Example 17 includes, in response to a transition of the input from a first binary state to a second binary state in the first power domain: transitioning, by the level shifter, the first output, over a first time period, from the first binary state to the second binary state in the second power domain; and transitioning, by the level shifter, the second output, over a second time period, from the second binary state to the first binary state in the second power domain.

In Example 19, the subject matter of Example 18 includes, wherein: the first time period is not equal to the second time period.

In Example 20, the subject matter of Example 19 includes, in response to the transition of the input binary signal from the first state to the second state in the first power domain: transitioning the output of the ramp selection circuit, over a third time period, from the first state to the second state in the second power domain, the third time period being the shorter of the first time period and the second time period.

In Example 21, the subject matter of Example 20 includes, selecting, by the ramp selection circuit, the provided one of the first output and the inverted second output based on the first time period and the second time period.

In Example 22, the subject matter of Examples 18-21 includes, wherein the predetermined period of time of the delay circuit is at least the longer of the first time period and the second time period.

Example 23 is a semiconductor comprising: a first assembly operating in a first power domain; a memory array operating in a second power domain; and a level shifter assembly connected to the first assembly, comprising: a first inverter that operates in the first power domain and is coupled to an output of the first assembly; a first transistor coupled to the output of the first assembly and a first output of the level shifter assembly, the first output of the level shifter assembly operating in the second power domain; and a second transistor coupled to an output of the first inverter and a second output of the level shifter assembly, the second output of the level shifter assembly operating in the second power domain; and a ramp selection assembly connected to the level shifter assembly and the memory array, comprising: a second inverter coupled to the second output of the level shifter assembly; one or more logic gates that: select between the first output of the level shifter assembly and an output of the second inverter; and provide the selected output to the memory array.

Example 24 is at least one machine-readable medium including instructions that, when executed by processing circuitry, cause the processing circuitry to perform operations to implement any of Examples 1-23.

Example 25 is an apparatus comprising means to implement any of Examples 1-23.

Example 26 is a system to implement any of Examples 1-23.

Example 27 is a method to implement any of Examples 1-23.

The above detailed description includes references to the accompanying drawings, which form a part of the detailed description. The drawings show, by way of illustration, specific embodiments in which the inventive subject matter can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third." and the like are used merely as labels, and are not intended to impose numerical requirements on their objects.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the inventive subject matter should be determined with reference to the appended claims, along with the full scope of equivalents to which such claims are entitled.

What is claimed is:

1. A semiconductor device comprising:
   a level shifter that:
      receives an input in a first power domain;
      provides a first output in a second power domain; and
      provides a second output in the second power domain; and
   a ramp selection circuit that:
      receives as input the first output and the second output from the level shifter;
      inverts the second output; and
      provides one of the first output and the inverted second output as an output of the ramp selection circuit.

2. The semiconductor device of claim 1, wherein:
   the ramp selection circuit comprises a delay circuit that receives, as input, the output of the ramp selection circuit; and
   the ramp selection circuit selects the provided one of the first output and the inverted second output based on an output of the delay circuit.

3. The semiconductor device of claim 2, wherein the delay circuit provides, as output, the input of the delay circuit delayed by a predetermined period of time.

4. The semiconductor device of claim 3, wherein the ramp selection circuit comprises a NAND gate that takes, as input, an inverted output from the delay circuit and the first output of the level shifter.

5. The semiconductor device of claim 3, wherein the ramp selection circuit comprises a NAND gate that takes, as input, the output of the delay circuit and the inverted second output of the level shifter.

6. The semiconductor device of claim 1, wherein:
   the input in the first power domain comprises a binary signal;
   a steady-state output of the first output comprises the binary signal in the second power domain; and
   a steady-state output of the second output comprises the inverse of the binary signal in the second power domain.

7. The semiconductor device of claim 6, wherein:
   in response to a transition of the input binary signal from a first state to a second state in the first power domain:
      the first output transitions, over a first time period, from the first state to the second state in the second power domain; and
      the second output transitions, over a second time period, from the second state to the first state in the second power domain.

8. The semiconductor device of claim 7, wherein:
   the first time period is not equal to the second time period.

9. The semiconductor device of claim 8, wherein:
   in response to the transition of the input binary signal from the first state to the second state in the first power domain:
      the output of the ramp selection circuit transitions, over a third time period, from the first state to the second state in the second power domain, the third time period being the shorter of the first time period and the second time period.

10. The semiconductor device of claim 9, wherein:
    the ramp selection circuit selects the provided one of the first output and the inverted second output based on the first time period and the second time period.

11. The semiconductor device of claim 7, wherein a delay circuit provides, as output, an input of the delay circuit delayed by at least the longer of the first time period and the second time period.

12. A method comprising:
    receiving, by a level shifter, an input in a first power domain;
    providing, by the level shifter, a first output in a second power domain;
    providing, by the level shifter, a second output in the second power domain;
    receiving as input, by a ramp selection circuit, the first output and the second output from the level shifter;
    inverting, by the ramp selection circuit, the second output; and
    providing, by the ramp selection circuit, one of the first output and the inverted second output as an output.

13. The method of claim 12, further comprising:
    receiving as input, by a delay circuit component of the ramp selection circuit, the output of the ramp selection circuit; and
    selecting, by the ramp selection circuit, the one of the first output and the inverted second output based on an output of the delay circuit component.

14. The method of claim 13, further comprising:
providing as output, by the delay circuit, the input of the delay circuit delayed by a predetermined period of time.

15. The method of claim 14, further comprising:
receiving as input, by a NAND gate component of the ramp selection circuit, an inverted output from the delay circuit and the first output of the level shifter.

16. The method of claim 14, further comprising:
receiving as input, by a NAND gate component of the ramp selection circuit, the output of the delay circuit and the inverted second output of the level shifter.

17. The method of claim 12, wherein:
the receiving of the input in the first power domain comprises receiving a binary signal;
the providing of the first output in the second power domain comprises, in a steady state, providing the binary signal in the second power domain; and
the providing of the second output in the second power domain comprises, in a steady state, providing an inverse of the binary signal in the second power domain.

18. The method of claim 17, further comprising:
in response to a transition of the input from a first binary state to a second binary state in the first power domain:
transitioning, by the level shifter, the first output, over a first time period, from the first binary state to the second binary state in the second power domain; and
transitioning, by the level shifter, the second output, over a second time period, from the second binary state to the first binary state in the second power domain.

19. The method of claim 18, wherein:
the first time period is not equal to the second time period.

20. The method of claim 19, further comprising:
in response to the transition of the input binary signal from the first state to the second state in the first power domain:
transitioning the output of the ramp selection circuit, over a third time period, from the first state to the second state in the second power domain, the third time period being the shorter of the first time period and the second time period.

21. The method of claim 20, further comprising:
selecting, by the ramp selection circuit, the provided one of the first output and the inverted second output based on the first time period and the second time period.

22. The method of claim 18, wherein a delay circuit provides, as output, an input of the delay circuit delayed by at least the longer of the first time period and the second time period.

23. A memory device comprising:
a first assembly operating in a first power domain;
a memory array operating in a second power domain; and
a level shifter assembly connected to the first assembly, comprising:
a first inverter that operates in the first power domain and is coupled to an output of the first assembly;
a first transistor coupled to the output of the first assembly and a first output of the level shifter assembly, the first output of the level shifter assembly operating in the second power domain; and
a second transistor coupled to an output of the first inverter and a second output of the level shifter assembly, the second output of the level shifter assembly operating in the second power domain; and
a ramp selection assembly connected to the level shifter assembly and the memory array, comprising:
a second inverter coupled to the second output of the level shifter assembly;
one or more logic gates that:
select between the first output of the level shifter assembly and an output of the second inverter; and
provide the selected output to the memory array.

* * * * *